(12) United States Patent
Batude et al.

(10) Patent No.: US 9,246,006 B2
(45) Date of Patent: Jan. 26, 2016

(54) RECRYSTALLIZATION OF SOURCE AND DRAIN BLOCKS FROM ABOVE

(71) Applicants: COMMISSARIAT A L'ENERGIE ATOMIQUE ET AUX ENE ALT, Paris (FR); STMICROELECTRONICS SA, Montrouge (FR)

(72) Inventors: Perrine Batude, Dijon (FR); Frederic Mazen, Saint Egreve (FR); Benoit Sklenard, Grenoble (FR); Shay Reboh, Guilderland, NY (US)

(73) Assignees: Commissariat à l'énergie atomique et aux énergies alternatives, Paris (FR); STMICROELECTRONICS SA, Gentilly (FR)

( * ) Notice: Subject to any disclaimer, the term of this patent is extended or adjusted under 35 U.S.C. 154(b) by 0 days.

(21) Appl. No.: 14/453,800

(22) Filed: Aug. 7, 2014

(65) Prior Publication Data
US 2015/0044828 A1    Feb. 12, 2015

(30) Foreign Application Priority Data
Aug. 9, 2013  (FR) ...................................... 13 57929

(51) Int. Cl.
| | | |
|---|---|---|
| H01L 21/00 | (2006.01) | |
| H01L 29/786 | (2006.01) | |
| H01L 21/265 | (2006.01) | |
| H01L 21/324 | (2006.01) | |
| H01L 29/66 | (2006.01) | |
| H01L 29/10 | (2006.01) | |

(52) U.S. Cl.
CPC .... *H01L 29/78603* (2013.01); *H01L 21/26513* (2013.01); *H01L 21/324* (2013.01); *H01L 29/66772* (2013.01); *H01L 29/78654* (2013.01); *H01L 21/26506* (2013.01); *H01L 21/26586* (2013.01); *H01L 29/1045* (2013.01); *H01L 29/66628* (2013.01)

(58) Field of Classification Search
CPC ................... H01L 29/78603; H01L 29/66628; H01L 29/66772; H01L 29/78654; H01L 29/1045; H01L 21/26513; H01L 21/324; H01L 21/26506; H01L 21/26586
See application file for complete search history.

(56) References Cited

U.S. PATENT DOCUMENTS

| | | | |
|---|---|---|---|
| 6,403,433 B1 | 6/2002 | Yu et al. | |
| 7,211,489 B1 * | 5/2007 | Xiang et al. | 438/300 |

(Continued)

OTHER PUBLICATIONS

U.S. Appl. No. 14/579,069, filed Dec. 22, 2014, Reboh, et al.

(Continued)

*Primary Examiner* — Richard Booth
(74) *Attorney, Agent, or Firm* — Oblon, McClelland, Maier & Neustadt, L.L.P.

(57) ABSTRACT

A method for manufacturing a transistor is provided, including amorphization and doping, by one or more localized implantations, of given regions of source and drain blocks based on crystalline semi-conductor material disposed on an insulating layer of a semi-conductor on insulator substrate, the implantations being carried out so as to conserve at a surface of said blocks zones of crystalline semi-conductor material on regions of amorphous semi-conductor material; and recrystallization of at least one portion of said given regions.

7 Claims, 10 Drawing Sheets

(56) References Cited

U.S. PATENT DOCUMENTS

2009/0087971 A1 4/2009 Colombeau et al.
2015/0044841 A1 2/2015 Batude et al.

OTHER PUBLICATIONS

T. Signamarcheix, et al., "Fully depleted silicon on insulator MOSFETs on (1 1 0) surface for hybrid orientation technologies" Solid-State Electronics, vol. 59, No. 1, May 2011, pp. 1-5.

F.F. Morehead, Jr., et al., "A model for the formation of amorphous Si by ion bombardment" Radiation Effects: Incorporating Plasma Science and Plasma Technology, vol. 6:1, 1970, pp. 27-32 and cover page.

T.W. Simpson, et al., "Amorphization threshold in Si-implanted strained SiGe alloy layers" Meeting of the Materials Research Society, 1994, 9 Pages.

L. Grenouillet, et al., "Enabling epitaxy on ultrathin implanted SOI" International Conference on Solid State Devices and Materials, 2011, 2 Pages.

T. Signamarcheix, et al., "Crystallographic orientation engineering in silicon-on-insulator substrates" Applied Physics Letters, vol. 96, 2010, pp. 262111-1-262111-3 and cover page.

French Preliminary Search Report issued Apr. 29, 2014 in French Application 13 57929, filed on Aug. 9, 2013 (with English Translation of categories of Cited Documents).

* cited by examiner

RECRYSTALLIZATION OF SOURCE AND DRAIN BLOCKS FROM ABOVE

TECHNICAL FIELD AND PRIOR ART

The present invention relates to the field of microelectronics and more particularly to that of methods for fabricating transistors.

In order to improve the performances of a transistor implemented on a semi-conductor on insulator type substrate, for example of SOI type (SOI for silicon on insulator), it is known to form raised source and drain regions, in other words which are formed at least in part in semi-conductor blocks 12, 13 (FIG. 1A) which extend on either side of a gate 10, above an upper semi-conductor layer 4 of the substrate in which the channel of the transistor is provided.

The raised semi-conductor source and drain blocks may then be doped by implantation (FIG. 1A), said implantation having a tendency to destroy the crystalline structure of the doped semi-conductor material and to render it amorphous. An activation of the dopants in the amorphous semi-conductor material may then be carried out at low temperature, in particular comprised between 400° C. and 600° C. (FIG. 1B).

If the source and drain regions are implanted over their entire thickness, in other words down to an insulating layer 2 for example of BOX type (BOX for Buried Oxide) of the semi-conductor on insulator substrate, a recrystallization of the material rendered amorphous will be difficult, even impossible, to implement.

FIG. 2A, illustrates a case in which an implantation of the source and drain blocks has been carried out such that an interface 18 between a region 13a of a source block rendered amorphous by implantation and a zone 13b, situated under the region 13a of said source block, and in which the crystalline structure has been conserved and is located so close to the insulating layer 2 of an SOI type substrate that a re-crystallisation is difficult to carry out.

Since said interface 18 is not perfectly flat and is difficult to control precisely, it is generally sought to raise it with respect to the insulating layer 2 of the substrate, by carrying out a less deep implantation (FIG. 2B).

However, when the interface 18 is raised with respect to the insulating layer 2 of the semi-conductor on insulator substrate it proves delicate at the same time to be able to properly dope the regions close to the BOX and particularly the regions 21a, 21b situated on either side of the channel, under the insulating spacers 15a, 15b (FIG. 1B) particularly critical for the performances of transistors.

The problem is thus posed of finding a novel method of forming a transistor, having reduced access resistances, and which is improved in the light of the above identified drawbacks.

DESCRIPTION OF THE INVENTION

The present invention relates to, according to an embodiment, a method of implementing a transistor on a semi-conductor on insulator type substrate comprising steps consisting in:

a) rendering amorphous and doping, by means of one or more localised implantation(s), given regions of blocks of crystalline semi-conductor material lying on an insulating layer of a semi-conductor on insulator substrate and intended to form source and drain blocks arranged on either side of a zone in which a channel of the transistor is intended to be formed, the implantation(s) being carried out so as to conserve at the surface of said blocks a thickness of crystalline semi-conductor material on said given regions of semi-conductor material rendered amorphous, b) recrystallization and activation annealing of the dopants of at least one portion of said given regions.

Thus, while conserving at the surface a thickness of crystalline semi-conductor material above regions rendered amorphous of the semi-conductor source and drain blocks, it is possible thereafter to recrystallize easily these regions.

The recrystallization then takes place through a front heading vertically from the thickness of crystalline semi-conductor material conserved at the surface towards the insulating layer of the semi-conductor on insulator substrate.

Compared to a method according to the prior art, the implantation(s) may be implemented with higher doses and according to greater inclines, because it does not necessarily require conserving a high germ thickness of crystalline semi-conductor material close to the insulating layer of the substrate.

Thus, at least one of said implantations at step a) may be carried out using a beam inclined with respect to a normal to the principal plane of the substrate, such that said given regions of semi-conductor material rendered amorphous and doped extend under insulating spacers situated on either side of a gate of the transistor situated opposite said channel zone.

Compared to a method according to the prior art in which one would carry out an amorphization of the upper part of the source and drain blocks while keeping a lower crystalline part, the method according to the invention makes it possible either to achieve better activation of the dopants compared to a method according to the prior art in which the conserved lower crystalline part would be too great or to implement a better recrystallization of the regions rendered amorphous compared to a method according to the prior art in which the conserved crystalline lower part would be too small.

At step a), the amorphization and the doping may be carried out by several successive implantation steps comprising:

an implantation by means of a non-doping species so as to render amorphous at least one portion of said given regions, an implantation of a donor or acceptor doping species so as to carry out an N-type or P-type doping of at least one portion of said given regions.

The implantation by the doping species is advantageously carried out at a temperature above a critical temperature and above which whatever the implantation dose of this doping species, the semi-conductor material is not rendered amorphous. This critical temperature depends on the doping species implanted and the semi-conductor material implanted.

One thus avoids having to carry out a new recrystallization.

In a variant, at step a), the amorphization and the doping may be carried out by steps of:

implantation of a donor or acceptor doping species so as to carry out an N-type or P-type doping of at least one portion of said given regions, implantation by means of a non-doping species so as to render amorphous at least one portion of said given regions.

Similarly, the implantation by the doping species is advantageously carried out at a temperature above a critical temperature and above which whatever the implantation dose of this doping species, the semi-conductor material is not rendered amorphous.

The implantation by the doping species may be followed at step b) by at least another recrystallization annealing.

An implantation carried out at a temperature above the critical temperature, also called in the present application "hot implantation", also makes it possible to obtain a more uniform distribution of dopants.

The non-doping species used for the amorphization of the layer may be for example atoms of Si or Ge.

According to an implementation possibility of the method, the implantation(s) at step a) may be carried out such that said given regions of semi-conductor material rendered amorphous may be in contact with the insulating layer of the substrate.

According to an implementation possibility of the method, at step a), at least one step of implantation of an electron donor or acceptor doping species may be carried out so as to amorphize said given regions and jointly carry out an N-type or P-type doping of said given regions.

At step b) it is advantageously possible to carry out a recrystallization and activation annealing of the dopants at low temperature, i.e. at a temperature below 600° C.

The method according to invention thus makes it possible to adapt to important constraints in terms of thermal budget.

According to an implementation possibility of the method, at step a), several implantations may be carried out, of which:
  at least one first implantation of doping species using a beam inclined according to a first angle $\alpha_1$, such that $\alpha_1 > 0$ with respect to a normal to the principal plane of the substrate,
  at least one second implantation using a vertical beam or beam inclined according to a second angle $\alpha_2$, such that $0 < \alpha_2 \leq \alpha_1$ with respect to a normal to the principal plane of the substrate.

After step b), zones of alloy of semi-conductor material and metal may be formed from said semi-conductor blocks.

According to an implementation possibility, these zones of alloy of semi-conductor material and metal may be formed by:
  deposition of metal material on the conserved thickness of crystalline semi-conductor material, then
  thermal annealing, such that at least one portion of the regions rendered amorphous at step a) is transformed into alloy of semi-conductor material and metal.

According to an implementation possibility of the method, the blocks of semi-conductor material are formed of a first layer based on $Si_{x1}Ge_{y1}$, surmounted by a second layer based on $Si_{x2}Ge_{y2}$.

In this case, the interface between the crystalline semi-conductor material and the regions rendered amorphous is precisely defined and is located at the interface between the first layer based on $Si_{x1}Ge_{y1}$, and the second layer based on $Si_{x2}Ge_{y2}$, with $0 \leq y_2 < y_1$.

An embodiment further relates to a transistor on a semi-conductor-on-insulator substrate, the transistor comprising semiconductor material blocks lying on an insulating layer of the substrate and for forming source and drain blocks arranged on either side of an area in which a transistor channel is formed, wherein on the surface of the blocks: a thickness of crystalline semiconductor material is lying on regions of amorphous semiconductor material, the blocks of semiconductor material being formed from a first layer based on $Si_{x1}Ge_{y1}$, surmounted by a second layer based on $Si_{x2}Ge_{y2}$ with $0 \leq y_2 < y_1$, an interface between the crystalline semiconductor material and the amorphous region being located at an interface between the first layer based on $Si_{x1}Ge_{y1}$, and the second layer based on $Si_{x2}Ge_{y2}$.

BRIEF DESCRIPTION OF THE DRAWINGS

The present invention will be better understood on reading the description of examples of embodiment given purely for indication purposes and non-limiting, while referring to the appended drawings in which.

Figure 1A:
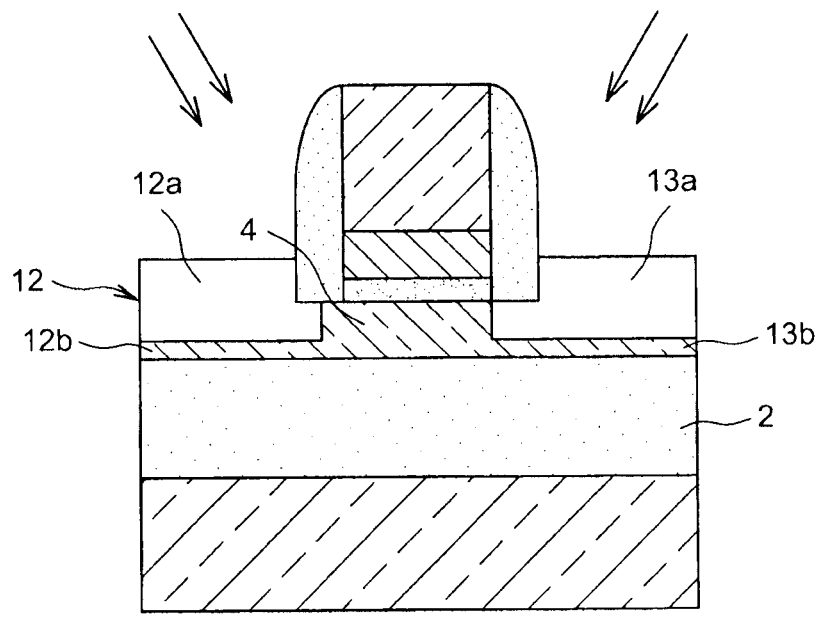
FIGS. 1A-1B illustrate an embodiment, according to the prior art, of source and drain blocks of an MOS transistor.
Figure 1B:
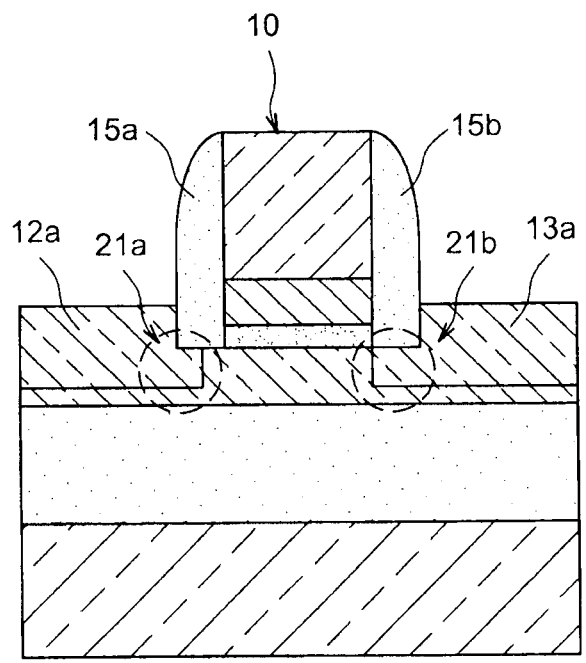
Figure 2A:
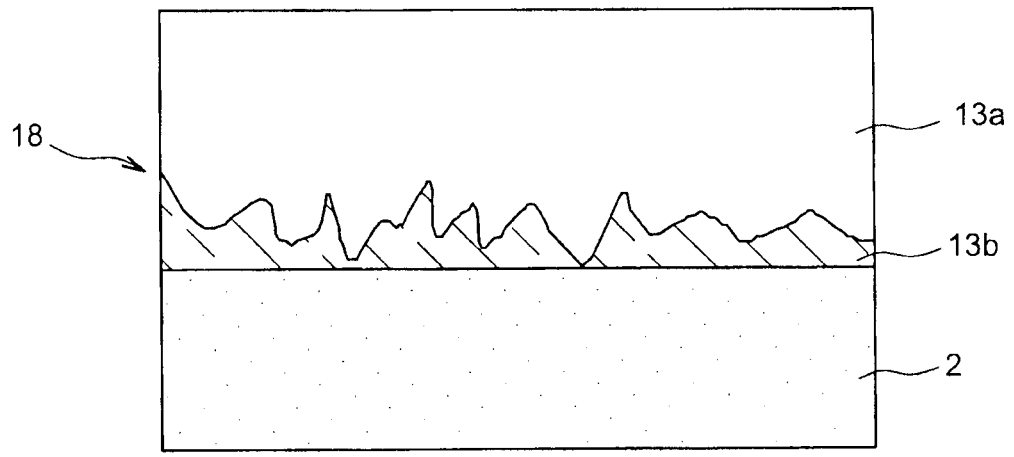
FIGS. 2A-2B illustrate, in a source region of a transistor that has been implanted, an interface between a zone rendered amorphous by said implantation and a zone in which the crystalline structure has not been impacted by the implantation.
Figure 2B:
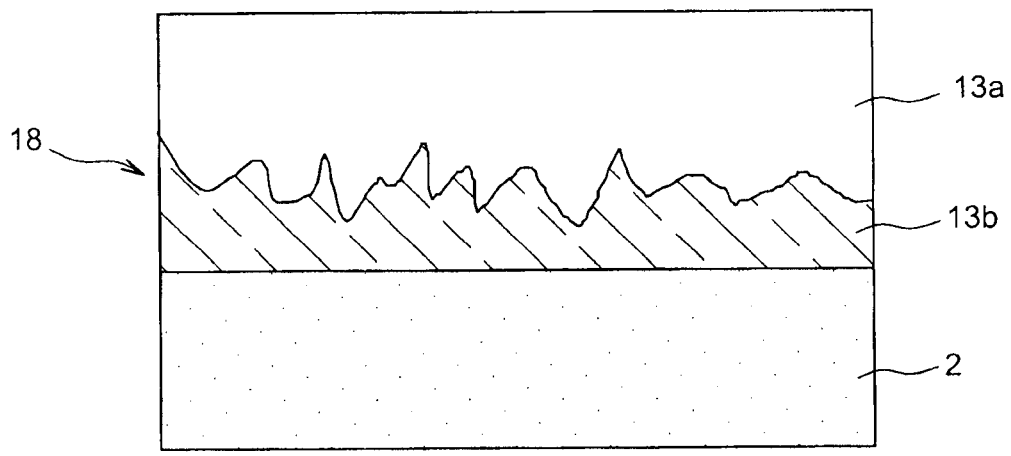

Identical, similar or equivalent parts of the different figures bear the same numerical references in order to make it easier to go from one figure to the next.

The different parts represented in the figures are not necessarily shown according to a uniform scale in order to make the figures more legible.

DETAILED DESCRIPTION OF PARTICULAR EMBODIMENTS

An example of method of forming a transistor will now be described with reference to FIGS. 3A-3E.

The starting material of this example of method may be a semi-conductor on insulator type substrate, for example of SOI type, which comprises a layer of semi-conductor support 101, an insulating layer 102 which may be based on silicon oxide and is arranged on and in contact with the support layer 101.

The insulating layer 102 of the substrate may be in particular a layer of BOX type (BOX for Buried Oxide) or TBOX type (TBOX for Thin Buried Oxide) of thickness for example of the order of 20 nm.

The substrate also comprises a thin semi-conductor layer 103 based on crystalline material situated on, and in contact with, said insulating layer 102. The thin semi-conductor layer 103 may be for example based on Si and of thickness comprised for example between 3 and 50 nm, for example of the order of 6 nm.

Steps of depositing a gate dielectric layer 109 and one or more layers 110, 111 of gate material(s), then etching of these layers in order to form a gate pattern 112 opposite a zone 104 of the thin semi-conductor layer 103 intended to form a channel for the transistor are carried out. The gate 112 of the transistor may be formed of a stack comprising a metal layer 110, for example based on TiN, on which lies a semi-conductor layer 11, for example based on polysilicon.

Insulating species 115a, 115b, for example based on $Si_xN_y$, are also formed against the lateral sides of the gate 112, and lie on the thin semi-conductor layer 103.

Then, crystalline semi-conductor material 117 is grown by epitaxy on the thin semi-conductor layer 103 in order to form with this thin semi-conductor layer 103 semi-conductor blocks 121, 123 intended to form raised source and drain regions and based on crystalline semi-conductor material arranged on either side of the channel zone 104 and spacers 115a, 115b. The thickness of semi-conductor material 117 that is made to grow may be for example of the order of 16 nm.

Figure 3A:
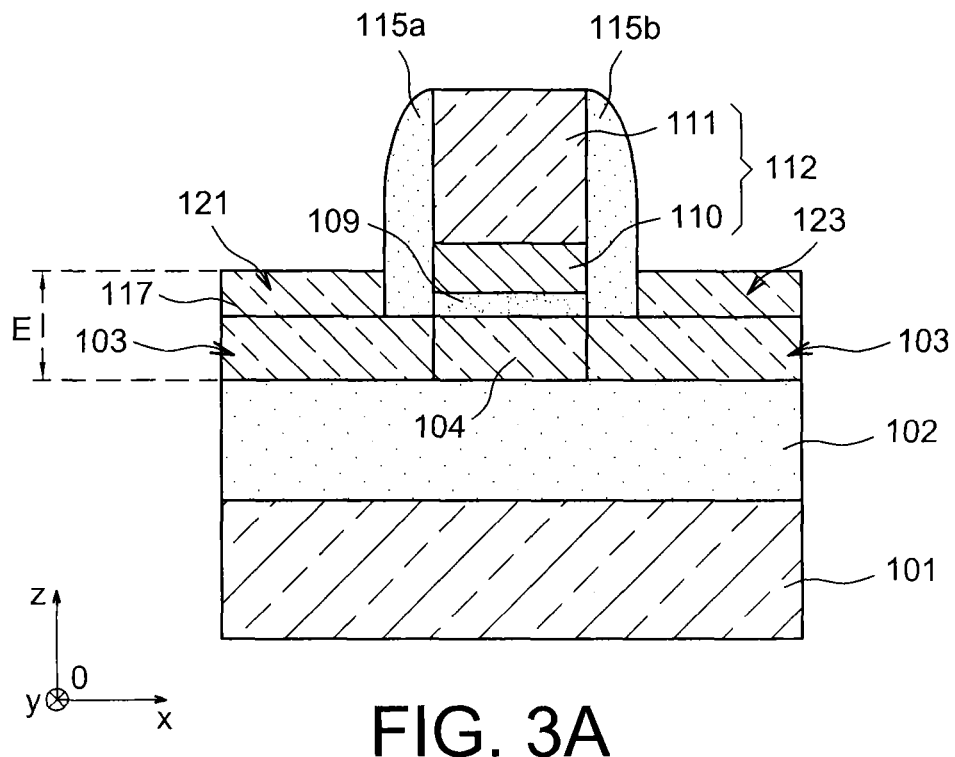
FIGS. 3A-3E illustrate a first example of method of implementation of a transistor in which a buried amorphization of semi-conductor source and drain blocks is carried out while conserving an upper zone in which the crystalline structure has not been impacted by the amorphizing implantation.

"Raised" is taken to mean that the blocks 121, 123, which, like the channel zone 104, lie on the insulating layer 102, extend above the thin semi-conductor layer 103 and thus have a thickness greater than that of the channel zone 104. The thickness E (measured in the direction of the axis z of the orthogonal reference point [O,x,y,z]) of the blocks 121, 123 may be for example of the order of 22 nm (FIG. 3A).

Then, a localised amorphization of regions 121a, 123a of semi-conductor blocks 121, 123 is carried out. In particular, an amorphization known as "buried" is carried out, such that the regions 121a, 123a of the blocks 121, 123 that are rendered amorphous are situated under zones 121b, 123b of the blocks 121, 123 situated on the surface and in which the crystalline structure is conserved. The regions rendered amorphous may extend to the insulating layer 102.

The buried amorphization may be carried out for example according to conditions as described in the document Signamarcheix T. et al., "Fully depleted silicon on insulator MOSFETs on (110) surface for hybrid orientation technologies" Solid-State Electronics Volume 59, Issue 1, May 2011.

Figure 3B:
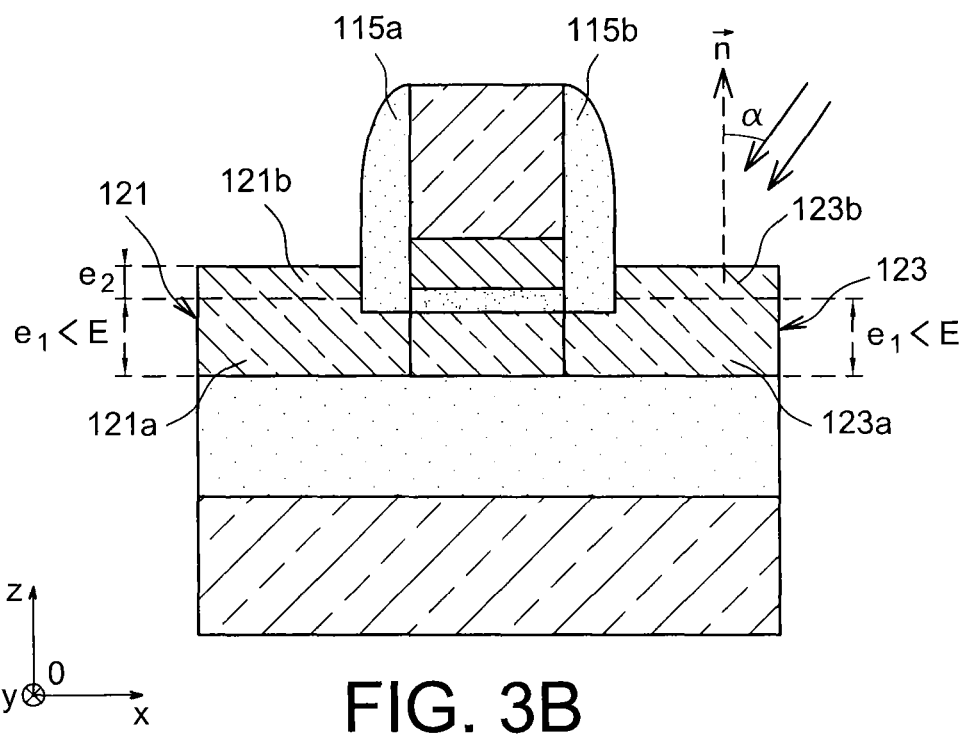

The amorphization may be carried out by means of at least one implantation step (FIG. 3B).

In this embodiment example, the amorphizing implantation of the semi-conductor material of the semi-conductor regions 121a, 123a is implemented by means of an electron donor doping species making it possible to carry out moreover an N-type doping, or by means of an electron acceptor doping species making it possible to carry out a P-type doping.

This implantation is also carried out so as to dope parts of the semi-conductor regions 121b, 123b situated under the spacers 115a, 115b, on either side of the channel zone 104.

Thus, at the same time as they are rendered amorphous, the access regions to the channel zone are doped.

To do so, it is possible to implement an implantation by means of an inclined beam forming a non-zero angle, with respect to a normal n to the principal plane of the substrate (the principal plane of the substrate being a plane defined by a plane going through the latter and parallel to the plane [O,x,y]).

An implantation according to a high dose, for example comprised between $5^e14$ and $4^e15$, and an angle, for example comprised between 10° and 60° makes it possible to attain and to dope the regions situated under the spacers 115a, 115b close to the channel zone 104.

At the end of the implantation or implantations, the regions 121a, 123a rendered amorphous extend, in a vertical direction, from the upper face of the insulating layer 102, to a given height equal to $e_1$ and which is less than the thickness E of the semi-conductor blocks 121, 123, the regions 121a, 123a being surmounted and in contact with zones 121b, 123b of crystalline semi-conductor material belonging to the semi-conductor blocks 121, 123, and in which the crystalline structure has not been impacted by the implantation(s).

The regions 121a, 123a rendered amorphous are also arranged against and in contact with the channel zone 104 based on crystalline semi-conductor material. The regions 121a, 123a rendered amorphous may have a thickness $e_1<E$, for example of the order of 12 nm.

The upper zones 121b, 123b based on crystalline semi-conductor material, and which are situated above regions 121a, 123a, may have a thickness $e_2<E$ for example of the order of 10 nm.

Figure 3C:
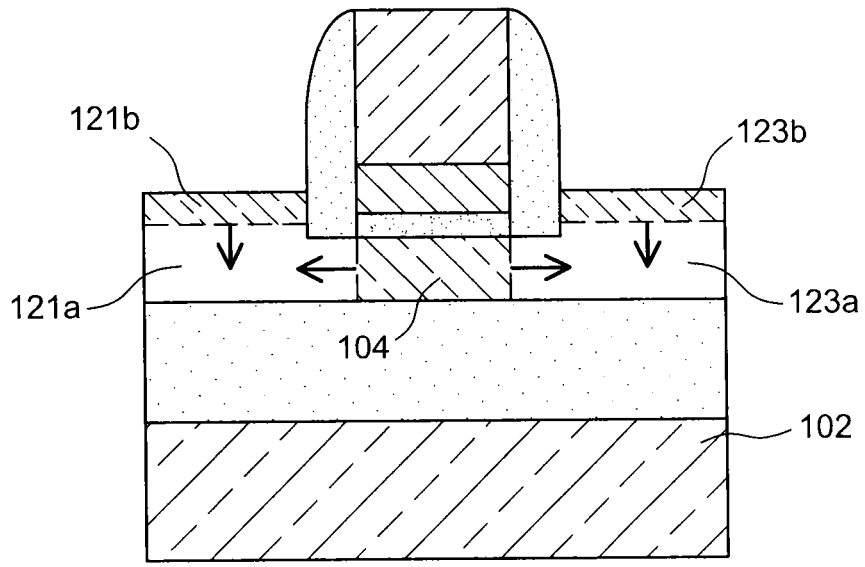

At least one thermal recrystallization and activation annealing of the dopants is then carried out (FIG. 3C).

Said annealing is thus carried out at a temperature chosen so as to make it possible to carry out both a recrystallization and an activation of the dopants. The annealing temperature may be a low temperature, i.e. below 600° C., and comprised for example between 400° C. and 600° C. The faces of the zones 121b, 123b of crystalline semi-conductor material surmounting the regions 121a, 123a serve as starting point for a recrystallization front that moves in a vertical direction (i.e. parallel to the direction defined by the axis z of the reference point [O,x,y,z]), towards the insulating layer 102.

The lateral faces of the channel zone 104 in contact with the regions 121a, 123a serve as starting point for another re-crystallisation front which moves in a horizontal direction (i.e. a direction parallel to the plane [O,x,y]). The vertical recrystallization front and the horizontal recrystallization front are intended to cross each other.

Figure 3D:
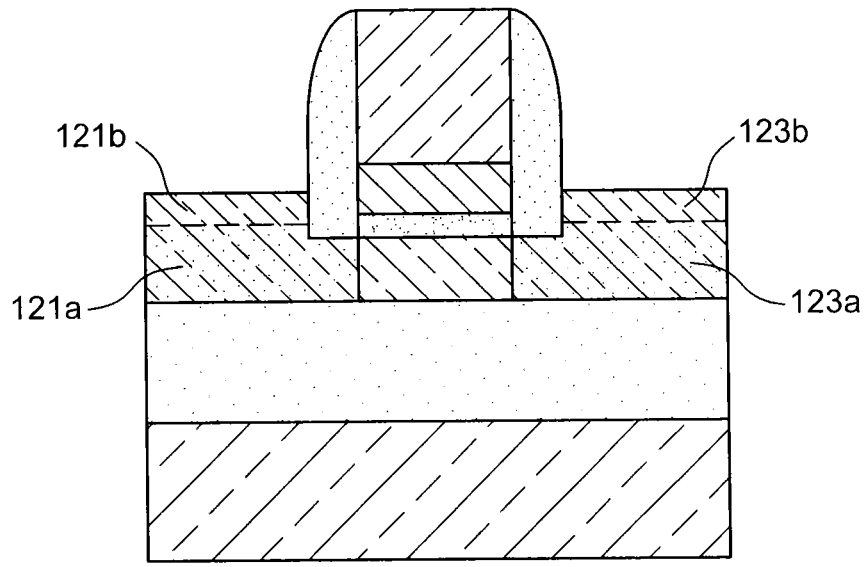
Figure 3E:
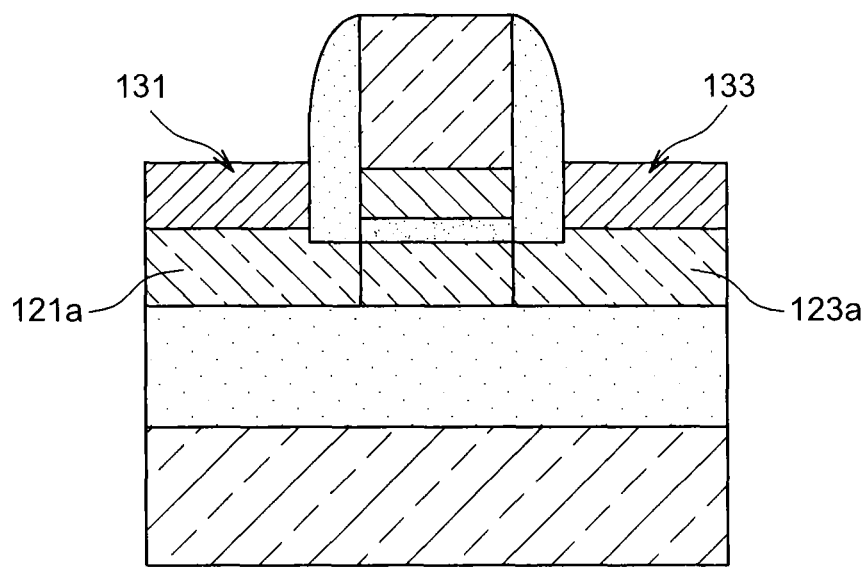

At the end of the annealing, the regions 121a, 123a may be entirely doped, and in particular in parts situated under the spacers 115a, 115b (FIG. 3D).

Then (FIG. 3E), zones 131, 133 of alloy of semi-conductor and metal are formed from the semi-conductor blocks 121, 123. This may be achieved by depositing a layer based on metal material, such as for example Ni or NiPt or Ti on the semi-conductor zones 121b, 123b then by thermal annealing. A silicidation of the zones 121b, 123b of crystalline semi-conductor material kept intact during the amorphization step described previously with reference to FIG. 3B, and a portion of the regions 121a, 123a rendered amorphous then re-crystallised makes it possible to reduce the contact resistances.

Figure 4A:
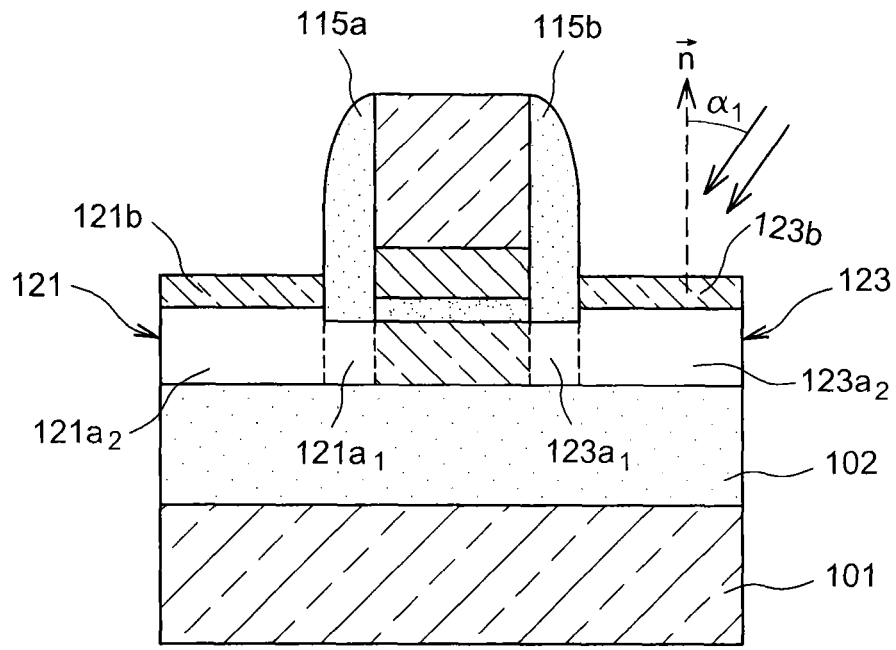
FIGS. 4A-4D illustrate a variant of the first example of the method of implementation of a transistor in which several implantations are carried out according to different incline angles in order to render amorphous and to dope different regions of semi-conductor source and drain blocks, while conserving a thickness in which the crystalline structure has not been impacted by the implantation above regions rendered amorphous and doped.
Figure 4B:
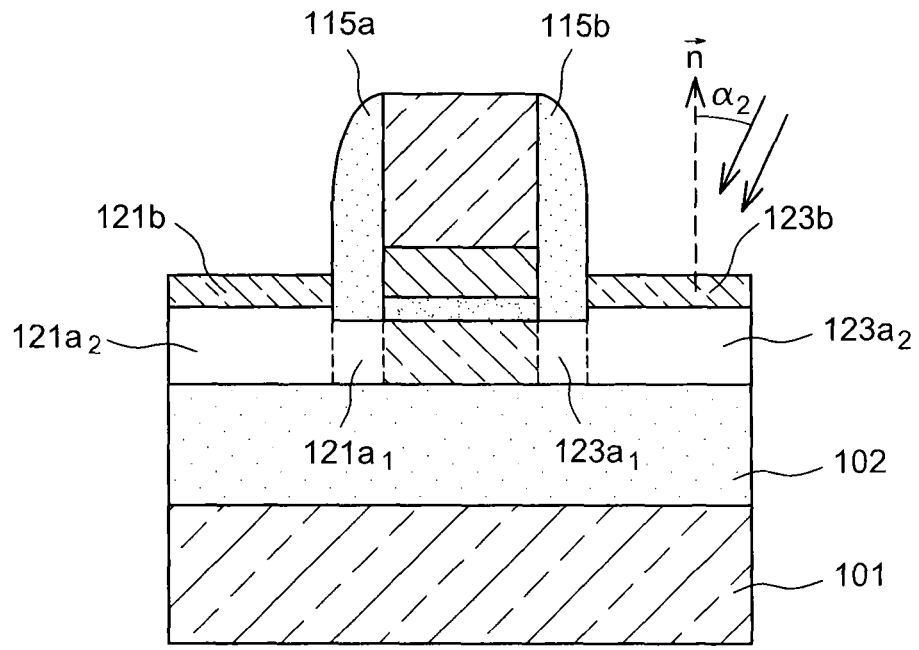

According to a variant of embodiment of the example that has been described, it is possible to replace the implantation step, as illustrated in FIG. 3B, by several implantations (FIGS. 4A-4C) in order to establish several different doping levels in different parts of the semi-conductor source and drain blocks 121, 123.

Thus, one can firstly carry out a first implantation (FIG. 4A) by means of an inclined beam forming a first angle $\alpha_1$, non-zero with respect to a normal n to the principal plane of the substrate, for example comprised between 10° and 60°, so as to be able to dope portions 121a1, 123a1 of the regions 121a, 123a situated under the spacers 115a, 115b, on either side of the channel zone 104. During this first implantation, other portions 121a2, 123a2 of the regions 121a, 123a situated around or on either side of the portions 121a1, 123a1 are also doped.

Figure 4C:
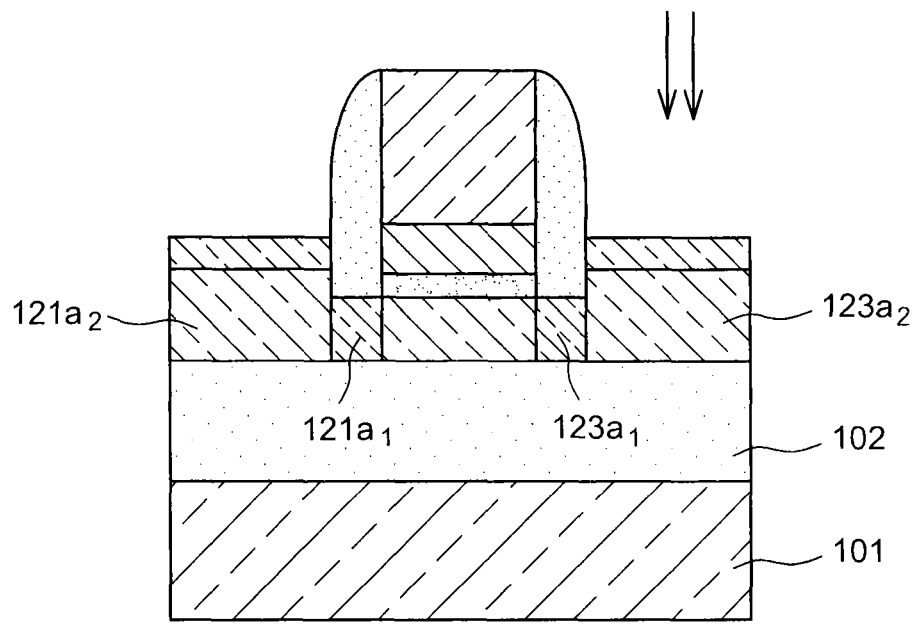

Then, at least one second implantation is carried out by means of a beam which may be inclined according to an angle $\alpha_2$, for example below 30°, smaller than for the first implantation (FIG. 4B), or instead by means of a vertical beam, in other words this time parallel to a normal n to the principal plane of the substrate (FIG. 4C). This second implantation may make it possible to dope specifically said other portions 121a2, 123a2 without doping those 121a1, 123a1 situated under the spacers 115a, 115b.

Figure 4D:
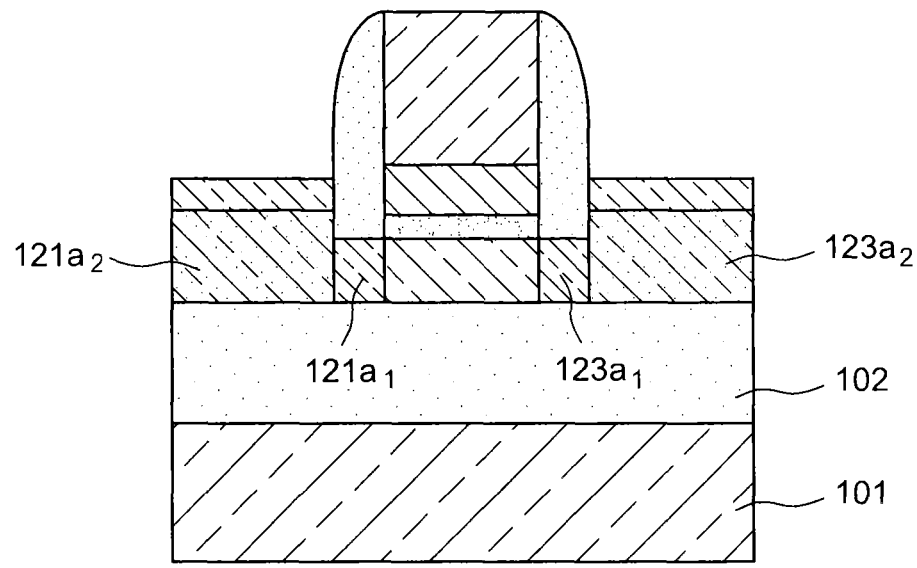

It is thus possible to form in the semi-conductor blocks 121, 123 heavily doped portions 121a2, 123a2, whereas the portions 121a1, 123a1 situated under the spacers 115a, 115b, are low doped or more lightly doped (FIG. 4D).

One can thus form a transistor comprising source and drain regions provided with a heavily doped portion (HDD or heavily doped source/drain) and a low doped portion (LDD or low doped source/drain).

According to an advantageous variant of the examples of embodiment that have been described, the steps of amorphization and doping of the semi-conductor regions 121a, 123a are dissociated.

Figure 5A:
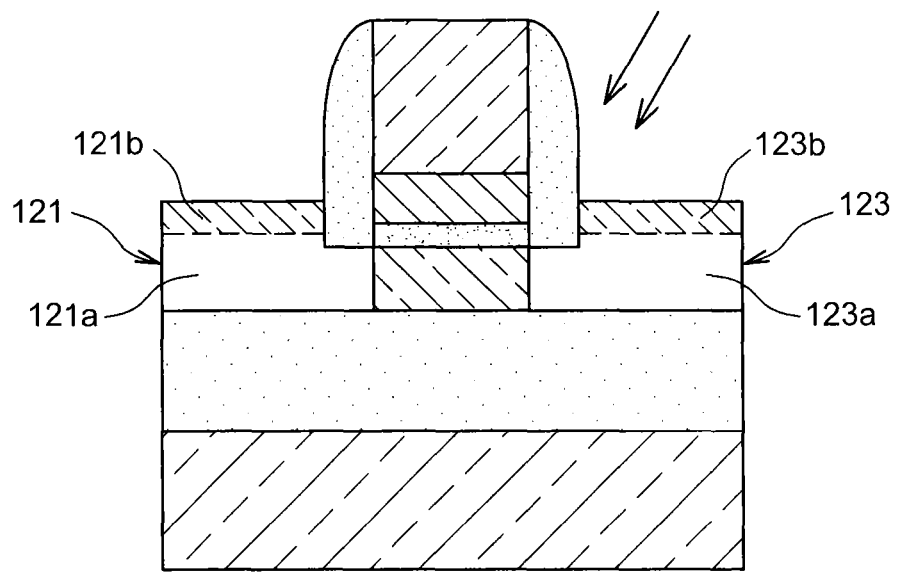
FIGS. 5A-5B and 6A-6B illustrate a variant of method of forming a transistor, in which the steps of amorphization of buried regions of semi-conductor source and drain blocks and N- or P-type doping are dissociated.
Figure 5B:
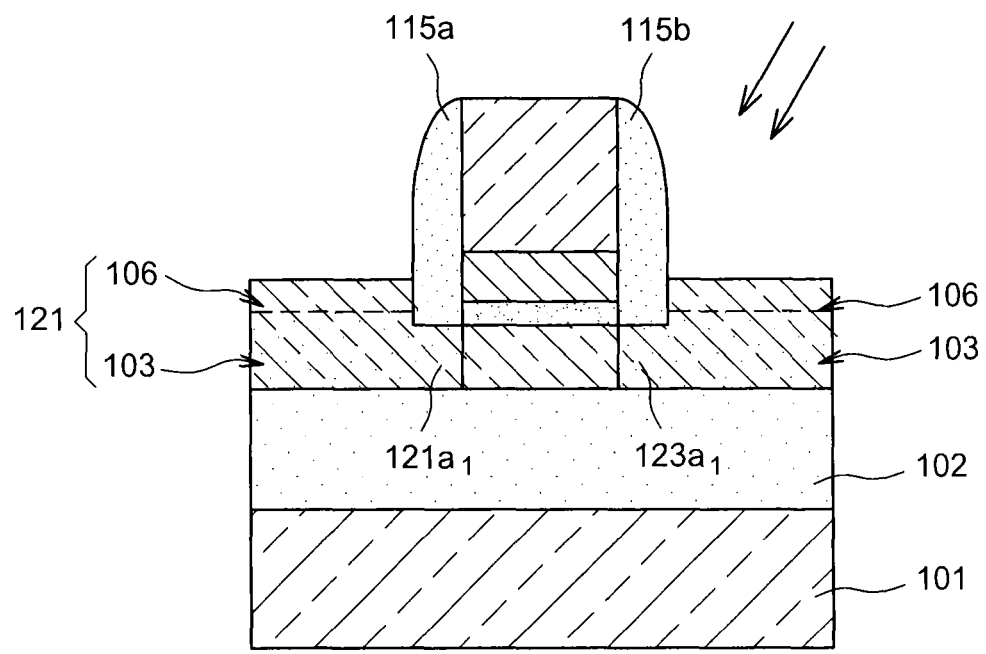

A first example of embodiment in which the steps of amorphization and N- and/or P-type doping are dissociated is illustrated in FIGS. 5A-5B.

In this example, after having formed the semi-conductor blocks 121, 123, it is firstly possible to carry out an amorphization of the semi-conductor regions 121a, 123a by means of an implantation (FIG. 5A).

One implants a species provided specifically to render amorphous the crystalline semi-conductor material of the amorphous regions 121a, 123a, without carrying out an N- or P-type doping. The implanted species may be based on atoms of a non-doping element such as for example Si or Ge.

The amorphization of the blocks 121, 123 is carried out such that a superficial thickness of crystalline semi-conductor material is conserved above the implanted regions 121a, 123a.

Another implantation is then carried out in order to carry out an N-type or P-type doping of the semi-conductor material of the semi-conductor regions 121a, 123a, the zones 121b, 123b not being doped.

Said doping may be carried out hot in order to prevent an undesired amorphization of certain semi-conductor zones, and in particular the zones 121b, 123b. A hot doping makes it possible to use high implantation energies and consequently to obtain a more uniform doping profile. Hot doping is taken to mean that the implantation is carried out at a temperature above a critical temperature Tc above which the semi-conductor material of the blocks 121, 123 of the semi-conductor layer may not be rendered amorphous.

A critical temperature Tc=T∞ one does not render amorphous a semi-conductor material whatever the dose, is described for example in the document "A model for the formation of amorphous Si by ion bombardment, Radiation Effects: Incorporating Plasma Science and Plasma Technology", of Morehead et al., 1970, 6:1, 27-32.

The choice of this temperature for those skilled in the art particularly depends on the semi-conductor material implanted and the species used to implement said implantation. The critical temperature Tc further depends on the implanted concentration of dopants.

The critical temperature Tc is for example of the order of 600K in the case where the doped semi-conductor material is silicon and the doping is carried out with arsenic.

Figure 6A:
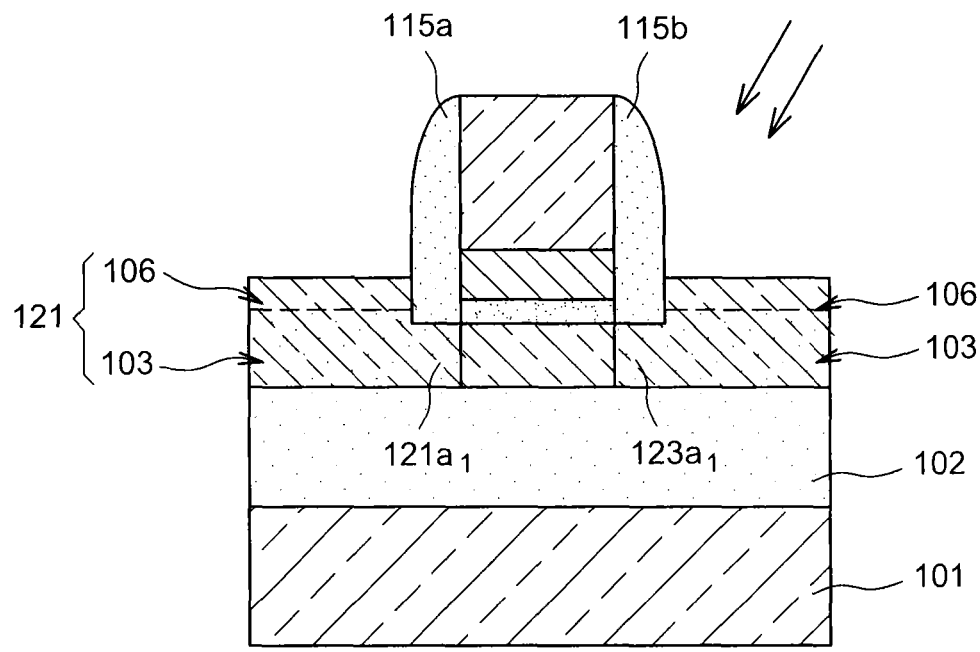
Figure 6B:
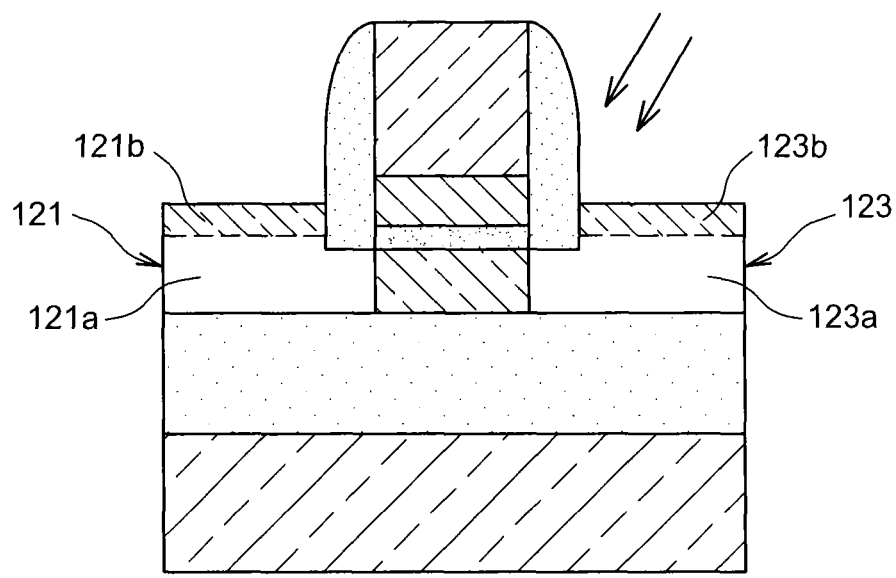

Another example of embodiment illustrated in FIGS. 6A-6B provides for reversing the steps of doping and amorphization.

A first implantation is thus firstly carried out to perform an N-type or P-type doping (FIG. 6A). The implantation is carried out at a temperature above the critical temperature Tc above which the semi-conductor material of the blocks 121, 123 of the semi-conductor layer may not be rendered amorphous.

A second implantation is then carried out, to render amorphous regions 121a, 123a of the semi-conductor blocks (FIG. 6B).

This second implantation may then be followed by a recrystallization annealing, for example at a temperature comprised between 400° C. and 600° C., in order to restore the crystalline structure of the regions 121a, 123a.

The hot implantation makes it possible to position high concentrations of dopants in the bottom of access zones of the transistor.

For example in the case where one implants a heavy dopant such as arsenic, a maximum concentration which would make it possible to leave a crystalline layer of 3 nm at the bottom of an access of 20 nm may be of the order of $1^e19$ atoms/cm$^3$.

With the present method using hot implantation, by correctly dimensioning the implantation conditions, in particular the temperature, the dose, the energy, the dose rate, it is possible to attain concentrations of dopants of the order of $1^e20$ atoms/cm$^3$ at the interface with the BOX insulating layer 102. A simulation tool for example of "Kinetic Monte Carlo" (KMC) type in particular such as developed by the firm Synopsys may make it possible to help those skilled in the art to dimension the hot implantation parameters.

Hot implantation also makes it possible to use higher energies without amorphizing the entire thickness of semi-conductor material. This also makes it possible to avoid having regions with too high concentration peaks. One thus avoids finding oneself in a range of concentration of dopants where these are capable of forming masses of dopants, also called "clusters".

Figure 7A:
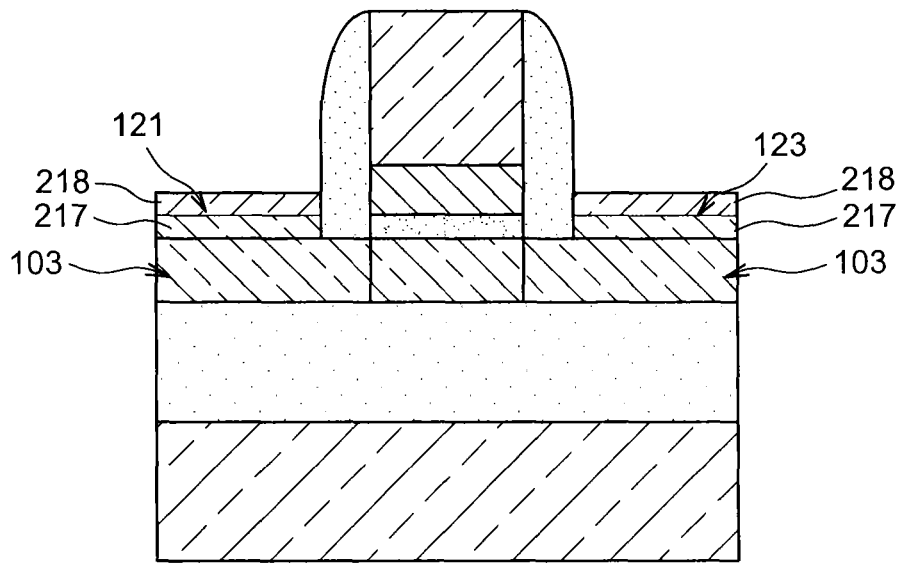
FIGS. 7A-7B illustrate a variant of embodiment in which the raised source and drain regions are formed of a stack of different semi-conductor materials in order to localise precisely an interface between amorphized zones and crystalline zones.
Figure 7B:
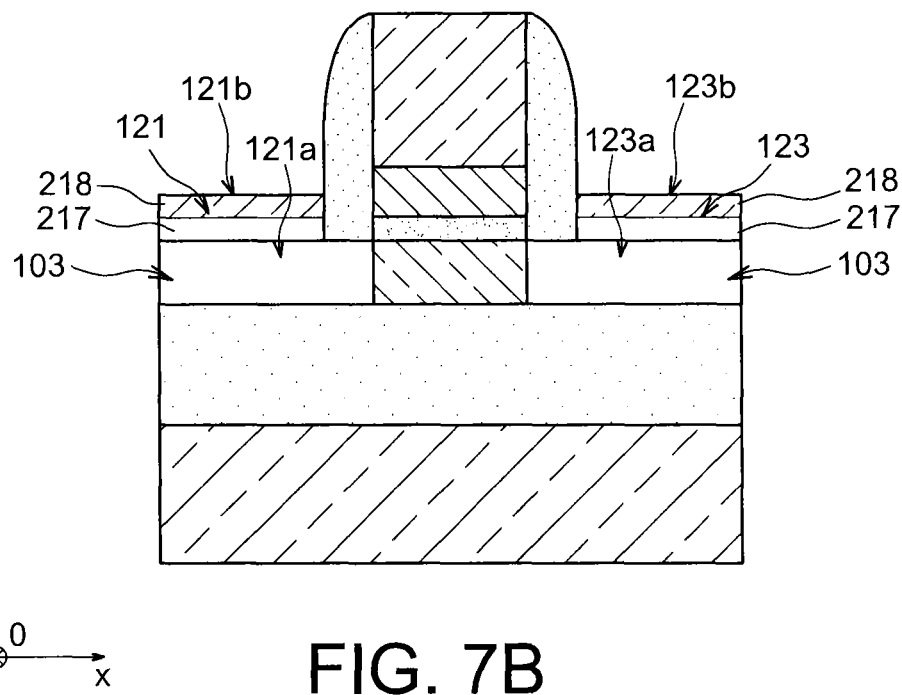

A variant of embodiment of the method is illustrated in FIGS. 7A-7B.

It provides semi-conductor blocks 121, 123 intended to form raised source and drain regions based on different semi-conductor materials.

To do so, one grows by epitaxy on the thin semi-conductor layer 103 a first layer of a crystalline semi-conductor material 217 having a lattice parameter different to that of the thin semi-conductor layer 103. When the thin semi-conductor layer 103 is based on Si, the crystalline semi-conductor material 217 may for example be based on $Si_{x1}Ge_{y1}$.

Then, one grows by epitaxy on the crystalline semi-conductor material 217 a second layer of another crystalline semi-conductor material 218 having a lattice parameter different to that of the material 217. The other crystalline semi-conductor material 218 may for example be based on $Si_{x2}Ge_{y2}$, with $0 \leq y_2 < y_1$ (FIG. 7A).

Then, the localised amorphization of regions of the semi-conductor blocks 121, 123 (FIG. 7B) is carried out.

The fact of providing a stack of different semi-conductor materials 217, 218 makes it possible to localise very precisely the amorphized zone and thus the interface between the amorphized zone and the crystalline zone.

The difference in concentration of Ge between the two layers of materials 217, 218 is chosen such that, apart from the amorphization of zones of the layer 103 which may be based on Si, only the layer of material 217, in this example based on $Si_{x1}Ge_{y1}$ "rich in Ge" or with richer Ge concentration, is amorphized.

The layer of material 218, in this example based on $Si_{x2}Ge_{y2}$ then belongs to the zone left crystalline 121b, 123b and the layer $Si_{x1}Ge_{y1}$ belongs to the amorphous zone 121a, 123a. It is thus possible to carry out a selective amorphization by choosing $y_1$, $y_2$, the dose and the implantation temperature.

Thus, the interface between the amorphized zone and the zone remaining crystalline is defined in this example by the concentration of Ge and corresponds to the interface of the two layers of material 217, 218. Said interface is then very precisely localised and may have a reduced roughness.

This selectivity in the amorphization is for example described in the document "Amorphization threshold in Si implanted strained SiGe alloy layers" T. W. Simpson et al. EMRS November 94.

For example, the difference between the concentration of Ge of the lower zone and the upper zone is 5%.

In such a case where a PMOS transistor is formed, the lower zone may for example be such that $y_1=30\%$ while the upper region may be such that $y_2=20\%$. In the case for example where an NMOS transistor is formed, the lower zone may for example be such that $y_1$ is comprised between 5% and 10%, while the upper region may be such that $y_2=0\%$.

Those skilled in the art will know how to obtain experimental curves to determine the difference in concentration of Ge as a function of the value of the dose and the temperature to obtain a selective amorphization.

A hot implantation is then carried out in order to achieve an N-type or P-type doping of the semi-conductor material of the semi-conductor regions 121a, 123a.

One or the other of the methods that have been described apply for example to the formation of transistors of FDSOI type (FDSOI for Fully Depleted Silicon On Insulator), and in particular to the manufacture of transistors using a small thermal budget, for example below 600° C.

The invention claimed is:

1. A method for forming a transistor on a semi-conductor on insulator type substrate, comprising:
   a) rendering amorphous, regions of blocks of crystalline semi-conductor material disposed on an insulating layer of the substrate, by a plurality of localised implantations, forming source and drain blocks arranged on either side of a zone corresponding to a channel region of the transistor,
   the plurality of implantations being carried out so as to keep at surface regions of said blocks a thickness of crystalline semi-conductor material on said rendered amorphous regions,
   the rendering being carried out by the plurality of implantations comprising doping steps, in the following order or in the opposite order:
      a first implantation by a non-doping species, which renders amorphous at least one portion of said regions under the surface regions, and
      another implantation by a doping species, which carries out an N-type doping or a P-type doping of said at least one portion of said regions under the surface regions, said another implantation being carried out at a temperature greater than a critical temperature above which said surface regions are not rendered amorphous by said another implantation; and
   b) recrystallizing and activation annealing of the doped said at least one portion of said regions under the surface regions.

2. The method according to claim 1, wherein at least one of said implantations at step a) is carried out using a beam inclined with respect to a normal to the principal plane of the substrate, such that said rendered amorphous and doped regions of semi-conductor material extend under insulating spacers disposed on either side of a gate of the transistor disposed opposite the zone corresponding to the channel region.

3. The method according to claim 1, wherein, at step a), the plurality of implantations comprise at least one step of implantation of an electron donor or acceptor doping species, which amorphizes said regions under the surface regions, and jointly carries out said N-type doping or said P-type doping of said at least one portion of said regions under the surface regions.

4. The method according to claim 3, wherein, at step b), the recrystallizing and activation annealing is carried out at a temperature below 600° C.

5. The method according to claim 1, wherein, at step a), said plurality of implantations include:
   at least one first implantation using a beam inclined according to a first angle $\alpha_1$, such that $\alpha_1>0$ with respect to a normal to the principal plane of the substrate, and
   at least one second implantation using a vertical beam or a beam inclined according to a second angle $\alpha_2$, such that $0<\alpha_2\leq\alpha_1$ with respect to the normal to the principal plane of the substrate.

6. The method according to claim 1, further comprising, after step b): forming zones of an alloy of semi-conductor material and metal from said semi-conductor blocks by:
   depositing metal material on the kept surface regions of said thickness of crystalline semi-conductor material, then
   thermal annealing of at least one portion of the rendered amorphous regions at step a), so as to transform said at least one portion into the alloy of semi-conductor material and metal.

7. The method according to claim 1, wherein the blocks of crystalline semi-conductor material are formed from a first layer based on $Si_{x1}Ge_{y1}$, surmounted by a second layer based on $Si_{x2}Ge_2$, with $0\leq y_2 < y_1$, the amorphization at step a) being carried out such that an interface between the crystalline semi-conductor material and the rendered amorphous regions is disposed at an interface between the first layer based on $Si_{x1}Ge_{y1}$ and the second layer based on $Si_{x2}Ge_{y2}$.

* * * * *